United States Patent
deVilliers et al.

(10) Patent No.: US 11,848,236 B2
(45) Date of Patent: Dec. 19, 2023

(54) METHOD FOR RECESSING A FILL MATERIAL WITHIN OPENINGS FORMED ON A PATTERNED SUBSTRATE

(71) Applicant: Tokyo Electron Limited, Tokyo (JP)

(72) Inventors: Anton deVilliers, Clifton Park, NY (US); Michael Murphy, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 296 days.

(21) Appl. No.: 17/479,072

(22) Filed: Sep. 20, 2021

(65) Prior Publication Data
US 2022/0172991 A1 Jun. 2, 2022

Related U.S. Application Data

(60) Provisional application No. 63/120,480, filed on Dec. 2, 2020.

(51) Int. Cl.
*H01L 21/768* (2006.01)

(52) U.S. Cl.
CPC .. *H01L 21/76898* (2013.01); *H01L 21/76879* (2013.01); *H01L 21/76883* (2013.01)

(58) Field of Classification Search
None
See application file for complete search history.

(56) References Cited

U.S. PATENT DOCUMENTS

| 10,236,292 | B1 | 3/2019 | Frougier et al. | |
|---|---|---|---|---|
| 2015/0294863 | A1* | 10/2015 | Nemani | H01L 21/31155 438/780 |
| 2018/0374791 | A1 | 12/2018 | Smith et al. | |
| 2019/0229011 | A1 | 7/2019 | Suk et al. | |
| 2020/0185413 | A1 | 6/2020 | Kim et al. | |
| 2020/0388711 | A1* | 12/2020 | Doyle | H01L 29/66742 |

FOREIGN PATENT DOCUMENTS

WO 2018195423 A1 10/2018

OTHER PUBLICATIONS

PCT International Search Report and Written Opinion, PCT Application No. PCT/US2021/051019, dated Jan. 7, 2022, 8 pages.

* cited by examiner

*Primary Examiner* — Roberts P Culbert
(74) *Attorney, Agent, or Firm* — Slater Matsil, LLP

(57) ABSTRACT

Process flows and methods are provided for recessing a fill material within openings formed within a patterned substrate. The openings are formed within a multilayer stack comprising a target material layer and one or more additional material layers, which overly and differ from the target material layer. After the openings are formed within the multilayer stack, a grafting material comprising a solubility-shifting agent is selectively deposited within the openings, such that the grafting material adheres to the target material layer without adhering to the additional material layer(s) overlying the target material layer. Next, a fill material is deposited within the openings and the solubility-shifting agent is activated to change the solubility of a portion of the fill material adjacent to and surrounding the grafting material. Then, a wet development process is used to remove the soluble/insoluble portions of fill material to the recess the fill material within the openings.

20 Claims, 9 Drawing Sheets

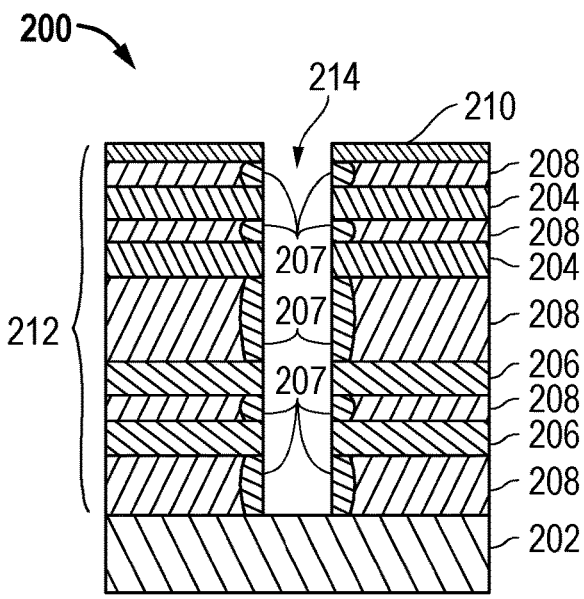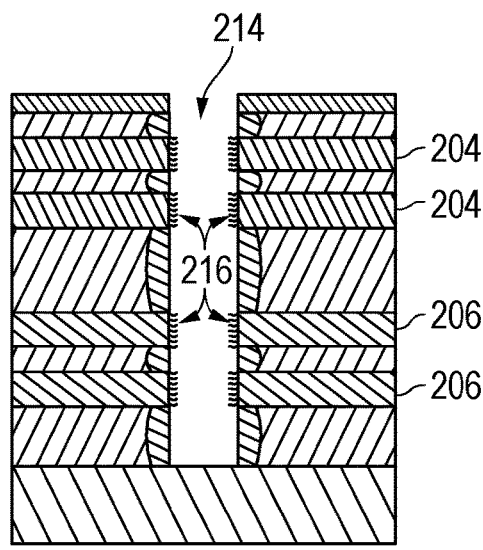
FIG. 2A  FIG. 2B
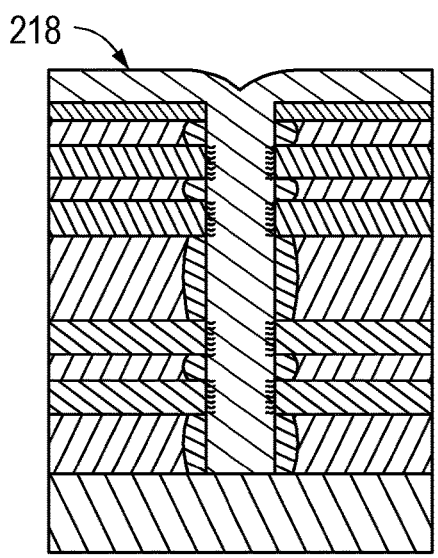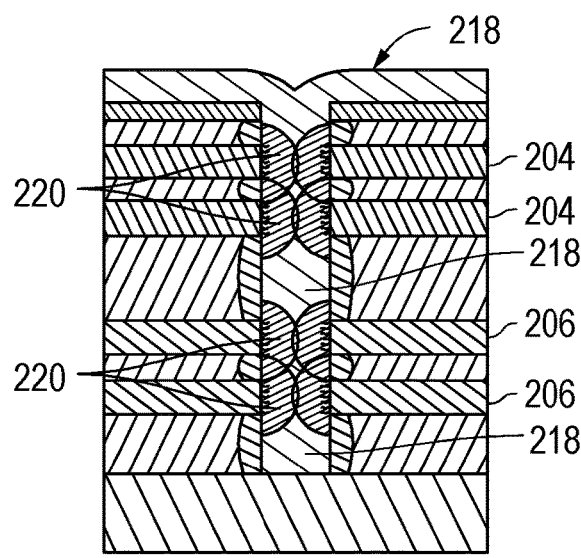
FIG. 2C  FIG. 2D

METHOD FOR RECESSING A FILL MATERIAL WITHIN OPENINGS FORMED ON A PATTERNED SUBSTRATE

PRIORITY CLAIM

This application claims priority to U.S. Provisional Patent Application No. 63/120,480, filed Dec. 2, 2020, the disclosures of which are expressly incorporated herein, in their entirety, by reference.

BACKGROUND

The present disclosure relates to the processing of substrates. In particular, it provides a novel process flow and method for recessing a film within openings formed on a substrate. In one embodiment, the process flow and method disclosed herein may be used for processing semiconductor substrates.

As geometries in substrate processing continue to shrink, the technical challenges to forming structures on substrates increase. New process flows and patterning techniques continue to evolve to address these challenges. In some process flows, a variety of structures can be formed on a patterned substrate by forming openings in the patterned substrate (e.g., trenches, contacts, holes, etc.), filling the openings with a fill material and removing portions of the fill material to recess the fill material within the openings. Controlling the fill recess within a patterned substrate or topography has become increasingly difficult as geometries continue to shrink and aspect ratios increase. In some advanced processes, controlling the fill recess within narrow and/or high aspect ratio openings may require nanometer-level precision. Unfortunately, current processes used to control fill recess (such as timed etch processes) have issues with throughput, variability and/or cost.

As such, it would be desirable to provide an improved process and method for recessing a fill material within openings formed on a patterned substrate.

SUMMARY

Improved process flows and methods are provided herein for recessing a fill material within a plurality of openings formed within a patterned substrate. More specifically, the present disclosure provides improved process flows and methods that use selective deposition of a grafting material and selective deprotection of a fill material to recess a fill material within openings formed within a patterned substrate.

The process flows and methods disclosed herein may be used to recess a fill material within a wide variety of openings (e.g., trenches, contacts, holes, etc.) or features (e.g., multilayer spacers) formed on a patterned substrate, such as a semiconductor substrate. In the present disclosure, the openings are formed within a multilayer stack, which includes at least one target material layer and one or more additional material layers overlying the target material layer, wherein the additional material layer(s) differ from the target material layer. In some embodiments, the multilayer stack may include one target material layer and one or more additional material layers overlying the target material layer. In other embodiments, the multilayer stack may include a plurality of target material layers, which are interspersed throughout the multilayer stack and separated from one another by additional material layers, which differ from the target material layers.

After openings are formed within the multilayer stack, a grafting material is selectively deposited within the openings, such that the grafting material adheres to the target material layer without adhering to the additional material layer(s) overlying the target material layer. The grafting material selectively deposited within the openings contains (or is functionalized with) a solubility-shifting agent, which may be activated to alter the solubility of an adjacent material. Examples of solubility-shifting agents include, but are not limited to, acid generators such as photo-acid generators (PAGs) or thermal-acid generators (TAGs). After the grafting material is selectively deposited within the openings, a fill material is deposited within the openings and the solubility-shifting agent is activated to change the solubility of a portion of the fill material adjacent to and surrounding the grafting material. Once the solubility-shifting agent is activated to change the solubility of the portion of the fill material, a wet development process may be used to remove the soluble and/or insoluble portions of fill material from the openings to thereby the recess the fill material within the openings.

In a one embodiment, a method for recessing a fill material within openings formed within a patterned substrate is provided. The method may include receiving the patterned substrate comprising the openings, wherein the openings are formed within a multilayer stack comprising a target material layer and one or more additional material layers overlying the target material layer, wherein the one or more additional material layers differ from the target material layer. The method further includes selectively depositing a grafting material within the openings, such that the grafting material adheres to the target material layer without adhering to the one or more additional material layers overlying the target material layer, and wherein the grafting material includes a solubility-shifting agent. The method further comprises depositing the fill material within the openings and causing the solubility-shifting agent to diffuse into a portion of the fill material surrounding the grafting material, wherein diffusion of the solubility-shifting agent causes the portion of the fill material to become insoluble to a predetermined solvent. Further, the method includes recessing the fill material within the openings by using the predetermined solvent to remove soluble portions of the fill material, while leaving the portion of the fill material that is insoluble to the predetermined solvent within the openings.

In variations of the embodiments, the methods may be adapted so that the predetermined solvent removes the soluble portions of the fill material to a depth within the openings defined by the solubility-shifting agent and physical characteristics of the target material layer. In other variations, the grafting material is selectively deposited onto opposing sidewalls of the openings at a depth defined by the target material layer, and wherein the solubility-shifting agent causes solubility changing reactions to occur within a region, which extends radially from the grafting material deposited onto the opposing sidewalls into the portion of the fill material to form a complete layer of insoluble material at the depth of the target material layer. In still other variations, the grafting material is selectively deposited within the openings by forming self-assembled monolayers (SAMs) on opposing sidewall surfaces of the target material layer, and wherein the fill material is an acid protected resin. In other variations, the predetermined solvent is an organic solvent. In some variations, after using the predetermined solvent to remove soluble portions of the fill material, the recessing the fill material further comprises using an aqueous solvent to remove the portion of the fill material that is insoluble to the predetermined solvent from the openings.

In some variations of the embodiments, the SAMs are functionalized with a photo-acid generator (PAG) or a thermal-acid generator (TAG). In some cases, the SAMs are functionalized with a photo-acid generator (PAG), and wherein said causing the solubility-shifting agent to diffuse into the portion of the fill material surrounding the grafting material comprises irradiating the PAG to generate an acid and performing a bake process to diffuse the acid into the portion of the fill material, wherein the acid diffusion converts the acid protected resin within the portion of the fill material into an acid deprotected resin. In other cases, the SAMs are functionalized with a thermal-acid generator (TAG), and wherein said causing the solubility-shifting agent to diffuse into the portion of the fill material surrounding the grafting material comprises performing a bake process to generate an acid and diffuse the acid into the portion of the fill material, wherein the acid diffusion converts the acid protected resin within the portion of the fill material into an acid deprotected resin.

In another embodiment, a method for recessing a fill material within openings formed within a patterned substrate is provided. The method may comprise receiving the patterned substrate comprising the openings, wherein the openings are formed within a multilayer stack comprising a target material layer and one or more additional material layers overlying the target material layer, wherein the one or more additional material layers differ from the target material layer. The method further comprises selectively depositing a grafting material within the openings, such that the grafting material adheres to the target material layer without adhering to the one or more additional material layers overlying the target material layer, and wherein the grafting material comprises an acid generator. The method also comprises depositing the fill material within the openings, wherein the fill material is an acid protected material. The method further comprises activating the acid generator within the grafting material to generate and diffuse an acid into a portion of the fill material surrounding the grafting material, wherein the acid diffusion converts the portion of the fill material into an acid deprotected material. The method also comprises recessing the fill material within the openings by using a first solvent to remove portions of the acid protected material overlying the portion of the fill material containing the acid deprotected material.

In variations of this another method, the grafting material is selectively deposited onto opposing sidewalls of the openings at a depth defined by the target material layer, and wherein the acid diffuses radially from the grafting material deposited onto the opposing sidewalls into the portion of the fill material to form a complete layer of acid deprotected material at the depth of the target material layer. In other variations, the grafting material is selectively deposited within the openings by forming self-assembled monolayers (SAMs) on opposing sidewall surfaces of the target material layer. In still other variations, a head group of the SAMs comprise a thiol, a carboxylic acid, a phosphinic acid or a silane. In still other variations, the acid diffusion is localized to a region encompassing the grafting material. In some variations, said activating the acid generator comprises a bake process, and wherein a diffusion length and profile of the acid diffusion is dependent on a composition of the acid generator, a composition of the fill material, a bake temperature, a bake time and/or a molecular weight of the acid. In some variations, the first solvent is an organic solvent. In some variations, after using the first solvent to remove portions of the acid protected material overlying the portion of the fill material containing the acid deprotected material, said recessing the fill material further comprises using a second solvent to remove the portion of the fill material containing the acid deprotected material. In some variations, the second solvent is an aqueous solvent.

In some embodiments of the methods described, the acid generator is a photo-acid generator (PAG), and wherein said activating the acid generator comprises irradiating the PAG to generate the acid and performing a bake process to diffuse the acid into the portion of the fill material. In other embodiments, the acid generator is a thermal-acid generator (TAG), and wherein said activating the acid generator comprises performing a bake process to generate the acid and diffuse the acid into the portion of the fill material.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 2A-2M illustrate an example process flow for forming epitaxial features on complementary field effect transistors (CFETs) that utilizes the techniques disclosed herein.

DETAILED DESCRIPTION

Figures 1A, 1B:
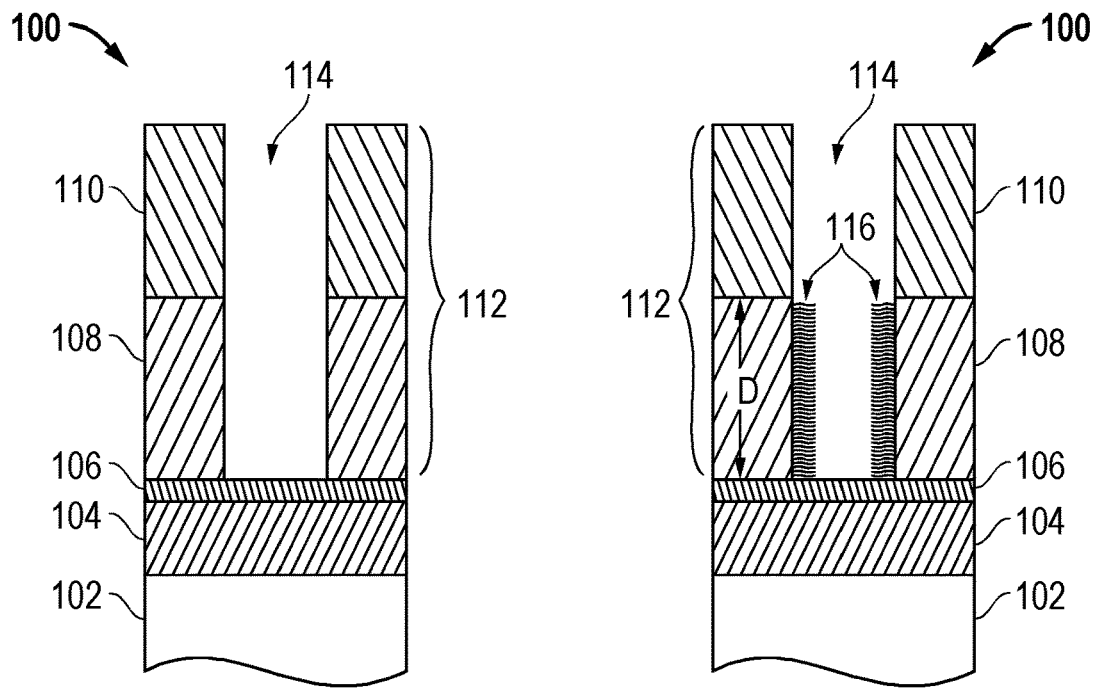
FIGS. 1A-1E illustrate one embodiment of an improved process flow, which may be used to recess a fill material within a plurality of openings formed on a patterned substrate in accordance with the techniques disclosed herein.

Improved process flows and methods are provided herein for recessing a fill material within a plurality of openings formed within a patterned substrate. More specifically, the present disclosure provides improved process flows and methods that use selective deposition of a grafting material and selective deprotection of a fill material to recess a fill material within openings formed within a patterned substrate.

The process flows and methods disclosed herein may be used to recess a fill material within a wide variety of openings (e.g., trenches, contacts, holes, etc.) or features (e.g., multilayer spacers) formed on a patterned substrate, such as a semiconductor substrate. In the present disclosure, the openings are formed within a multilayer stack, which includes at least one target material layer and one or more additional material layers overlying the target material layer, wherein the additional material layer(s) differ from the target material layer. In some embodiments, the multilayer stack may include one target material layer and one or more additional material layers overlying the target material layer. In other embodiments, the multilayer stack may include a plurality of target material layers, which are interspersed throughout the multilayer stack and separated from one another by additional material layers, which differ from the target material layers.

After openings are formed within the multilayer stack, a grafting material is selectively deposited within the openings, such that the grafting material adheres to the target material layer without adhering to the additional material layer(s) overlying the target material layer. The grafting material selectively deposited within the openings contains (or is functionalized with) a solubility-shifting agent, which may be activated to alter the solubility of an adjacent material. Examples of solubility-shifting agents include, but are not limited to, acid generators such as photo-acid generators (PAGs) or thermal-acid generators (TAGs). After the grafting material is selectively deposited within the openings, a fill material is deposited within the openings and the solubility-shifting agent is activated to change the solubility of a portion of the fill material adjacent to and surrounding the grafting material. Once the solubility-shifting agent is activated to change the solubility of the portion of the fill material, a wet development process is used to remove the soluble and/or insoluble portions of fill material from the openings to thereby the recess the fill material within the openings.

In one example embodiment, the fill material may be a deprotectable material and the solubility-shifting agent may be activated to diffuse the solubility-shifting agent into the portion of the fill material adjacent to and surrounding the grafting material. The diffusion of the solubility-shifting agent into the portion of the fill material alters the solubility of that portion of fill material. For example, the diffusion of the solubility-shifting agent may cause the portion of the fill material to become insoluble to a predetermined solvent (such as, e.g., an organic solvent or developer), while remaining portions of the fill material remain soluble to the predetermined solvent. After the solubility-shifting agent is activated to alter the solubility of the portion of the fill material, the fill material may be recessed within the openings by using the predetermined solvent to remove the soluble portions of the fill material from the openings. In some embodiments, the fill material may be further recessed within the openings by using another solvent (e.g., an aqueous solvent or developer) to remove the portion of the fill material, which is insoluble to the predetermined solvent, from the openings.

In another example embodiment, the fill material may be an acid protected material and the solubility-shifting agent may be an acid generator, which can be activated to generate and diffuse an acid into the portion of the fill material adjacent to and surrounding the grafting material. The acid diffusion selectively deprotects the portion of the fill material adjacent to and surrounding the grafting material by converting the portion of the fill material into an acid deprotected material. After the solubility-shifting agent is activated to deprotect the portion of the fill material, the fill material may be recessed within the openings by using a first solvent (e.g., an organic solvent or developer) to remove portions of the acid protected material overlying the portion of the fill material containing the acid deprotected material. In some embodiments, the fill material may be further recessed within the openings by using a second solvent (e.g., an aqueous solvent or developer) to remove the portion of the fill material containing the acid deprotected material.

Thus, improved process flows and methods are disclosed herein for recessing a fill material within a plurality of openings formed within a patterned substrate, wherein the openings are formed within a multilayer stack comprising at least one target material layer and one or more additional material layers overlying the target material layer, wherein the additional material layer(s) differ from the target material layer. Unlike conventional processes, the process flows and methods disclosed herein create a self-aligned recess within a deprotectable fill material by: (a) selectively depositing a grafting material containing (or functionalized with) a solubility-shifting agent onto opposing sidewalls of the openings at a depth defined by the target material layer, (b) activating the solubility-shifting agent to selectively deprotect a portion of the fill material adjacent to and surrounding the grafting material, and (c) utilizing a wet development process that uses one or more solvents (e.g., an organic solvent followed by an aqueous solvent) to progressively remove the protected and deprotected fill material from the openings. The fill material, the solubility-shifting agent and/or the solvent(s) may be generally selected to ensure that the deprotected fill material has high dissolution contrast in the organic and aqueous solvents, compared to the protected fill material. In this manner, each development step may remove one layer of protected or deprotected fill material, depending on the composition of the solvent being used.

The amount of recess achieved using the techniques disclosed herein may generally depend on the composition of the multilayer stack (e.g., the number of isolated target material layer(s) included within the multilayer stack), the thickness of the grafting material selectively deposited on the sidewall surfaces of the target material layer(s), and the diffusion length of the solubility-shifting agent. After the grafting material is selectively deposited and the fill material is selectively deprotected, as disclosed herein, a wet development process of alternating solvents (e.g., alternating organic and aqueous solvents) may be used to progressively remove the protected and deprotected fill material from the openings. The alternating development process may be repeated any number of times needed to achieve a desired recess depth within a particular multilayer stack, provided that isolated target material layer(s) are formed within the stack.

FIGS. 1A-1E illustrate one embodiment of an improved process flow that can be used to recess a fill material within a plurality of openings formed on a patterned substrate in accordance with the techniques described herein. As shown in FIG. 1A, an opening 114 is formed within a multilayer stack 112 provided on a patterned substrate 100. The multilayer stack 112 may generally be formed over one or more underlying layers, such as but not limited to, a hard mask layer 106, an organic layer 104 and a base substrate layer 102. As described in more detail below, the multilayer stack 112 may include at least two different material layers, including at least one target material layer and one or more additional material layers overlying the target material layer. The opening 114 may be formed within the multilayer stack 112 using a wide variety of processes, as is known in the art. In some embodiments, the opening 114 may be a trench, contact or hole, which is etched or otherwise formed within the multilayer stack 112.

Base substrate layer 102 may be any substrate for which the use of patterned features is desirable. For example, base substrate layer 102 may be a semiconductor substrate having one or more semiconductor processing layers formed thereon. In one embodiment, base substrate layer 102 may be a substrate that has been subject to multiple semiconductor processing steps which yield a wide variety of structures and layers, all of which are known in the substrate processing art. The hard mask layer 106 and the organic layer 104 shown in FIG. 1A may also be formed from any of a wide variety of materials, as is known in the art. Although exemplary underlying layers are described and shown in the figures, the techniques described herein are not limited to any particular type or number of layers underlying the multilayer stack 112. As such, more, less or other underlying layers may be utilized.

In the embodiment shown in FIG. 1A, the multilayer stack 112 includes a target material layer 108 and an additional material layer 110 overlying the target material layer 108. The target material layer 108 and the additional material layer 110 may each be formed from any of a wide variety of materials, provided that different materials are used to form the target material layer 108 and the additional material layer 110. Although two layers are included within the multilayer stack 112 shown in FIG. 1A, the multilayer stack 112 is not limited to any particular number of layers and may include additional layers in other embodiments of the present disclosure. As such, a "multilayer stack" as described herein may include any number of target material layers, which are interspersed throughout the multilayer stack and separated or isolated from one another by additional material layers, which differ from the target material layer(s). By isolating the target additional layer(s) with additional material layer(s), the techniques described herein can be applied to vertically scalable designs and/or be used to achieve any desired recess depth.

In the embodiment shown in FIG. 1B, a grafting material 116 is selectively deposited within the opening 114, such that the grafting material 116 adheres to the target material layer 108 without adhering to the additional material layer 110 overlying the target material layer. More specifically, the grafting material 116 is selectively deposited onto opposing sidewalls of the opening 114 at a depth (D), which is defined by the target material layer 108. The grafting material 116 may generally be formed from any of a wide variety of materials.

In some embodiments, grafting material 116 may be selectively deposited within the opening 114 by forming self-assembled monolayers (SAMs) on opposing sidewall surfaces of the target material layer 108. As known in the art, SAMs are molecular assemblies or chains (comprising a head group, a tail group and a functional end group), which form spontaneously on surfaces by adsorption. In the present disclosure, SAMs are formed via adsorption of the head group onto on opposing sidewall surfaces of the target material layer 108 followed by organization of the tail group into a molecular chain. Although not strictly limited to such, the head group may comprise, for example, a thiol, a carboxylic acid, a phosphinic acid or a silane.

As known in the art, the terminal end of the molecular chain, or functional end group of the SAMs, can be functionalized to vary one or more properties of the SAMs. In the present disclosure, the functional end group is functionalized with a solubility-shifting agent, which is later activated to change the solubility of a material adjacent to the grafting material 116. In some embodiments of the present disclosure, the functional end group of the SAMs may be functionalized with an acid generator, such as a photo-acid generator (PAG) or a thermal-acid generator (TAG). When activated, the acid generator generates and diffuses an acid into the adjacent material to change the solubility of the adjacent material.

Figure 1C:
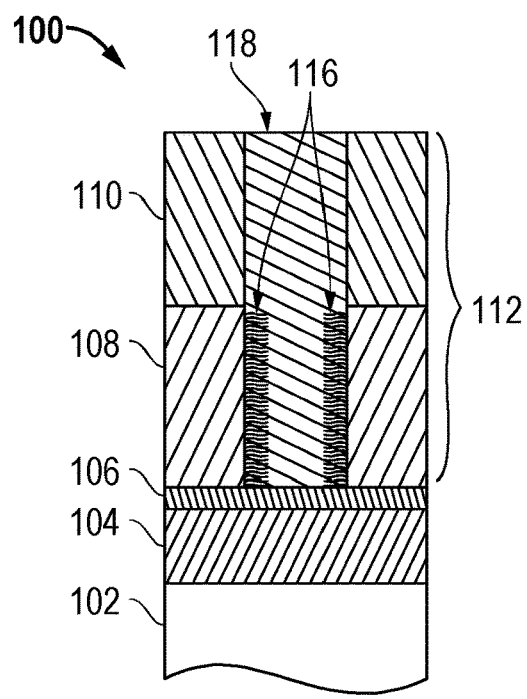

In the embodiment shown in FIG. 1C, the opening 114 is filled with a material, (i.e., a fill material 118) after the grafting material 116 is selectively deposited onto the sidewall surfaces of the target material layer 108. A wide variety of techniques and processes may be used to fill the opening 114 with the fill material 118. In some embodiments, the fill material 118 may be deposited within the opening 114 using chemical vapor deposition (CVD), plasma enhanced CVD (PECVD), physical vapor deposition (PVD), atomic layer deposition (ALD), spin coatings, spray coatings, and/or other deposition processes. Other processes known in the art may also be used to fill the opening 114 with the fill material 118. In addition to filling the opening 114, some embodiments of the present disclosure may deposit or otherwise provide the fill material 118 on top of the patterned substrate 100. The particular materials utilized for the various layers shown in FIGS. 1A-1C may vary depending upon the particular process flow and application for which the techniques described herein are utilized for. In some embodiments, the target material layer 108 may be comprised of oxide or nitride. In some embodiments, the additional material layer 110 may be comprised of silicon, oxide (for example silicon oxide, titanium oxide or hafnium oxide), or nitride (for example silicon nitride or titanium nitride). In some embodiments, the grafting material 116 may be comprised of thiol, carboxylic acid or silane. In some embodiments, the fill material 118 may be comprised of esters, acetals, or vinyl ethers. However, a wide variety of other materials may also be utilized to implement the techniques described herein.

In the present disclosure, the fill material 118 may be implemented with a wide variety of deprotectable materials. As known in the art, a "deprotectable material" is a material for which a protecting group has been added to the molecular structure of the material to prevent a subsequent chemical reaction from occurring. In some cases, a deprotectable material, or "protected material," can be deprotected by removing the protecting group from the molecular structure. When the protecting group is removed, the "protected material" is converted into a "deprotected material," which does not prevent subsequent reactions.

In some embodiments, fill material 118 may be implemented with an acid deprotectable resin (otherwise referred to as an acid protected resin), which can be deprotected with an acid. It is recognized, however, that fill material 118 is not strictly limited to acid deprotectable resins and may be implemented with other deprotectable materials.

Figure 1D:
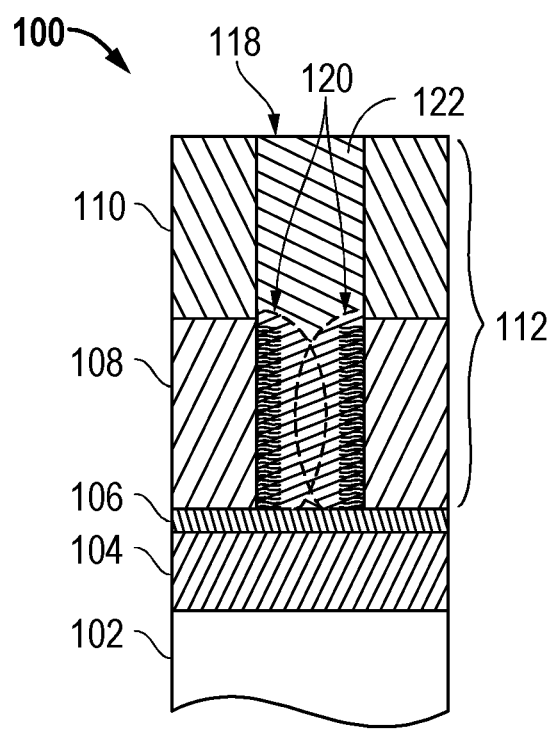

In the embodiment shown in FIG. 1D, the solubility-shifting agent within grafting material 116 is activated to diffuse the solubility-shifting agent into a portion 120 of the fill material 118 adjacent to and surrounding the grafting material 116. The activation and diffusion of the solubility-shifting agent causes solubility changing reactions to occur within the portion 120 of the fill material 118. In some embodiments, the activation and diffusion of the solubility-shifting agent may cause the portion 120 to become insoluble to a predetermined solvent.

In some embodiments, the solubility-shifting agent within grafting material 116 may comprise an acid generator, such as a photo-acid generator (PAG) or a thermal-acid generator (TAG). When grafting material 116 contains (or is functionalized with) a PAG, the solubility-shifting agent may be activated by irradiating the PAG to generate an acid, and performing a bake process to diffuse the acid into the portion 120 of the fill material 118. When grafting material 116 contains (or is functionalized with) a TAG, the solubility-shifting agent may be activated by performing a bake process to generate an acid and diffuse the acid into the portion 120 of the fill material 118. In either case, the acid diffusion alters the solubility of the portion 120 of the fill material 118 adjacent to and surrounding the grafting material 116 by converting the acid protected resin within the portion 120 into an acid deprotected resin. In other words, acid diffusion deprotects the portion 120 of the fill material 118 adjacent to and surrounding the grafting material 116.

As shown in FIG. 1D, the activation and diffusion of the solubility-shifting agent causes solubility changing reactions, which are localized to the depth (D) of the target material layer 108. More specifically, the activation and diffusion of the solubility-shifting agent causes solubility changing reactions to occur within a region (shown in dashed lines in FIG. 1D), which extends radially from the grafting material 116 deposited onto the opposing sidewall surfaces of the target material layer 108 into the portion 120 of the fill material 118. The acid diffusion length (e.g., the radial distance that acid diffuses into the fill material 118) is preferably chosen to be equal to, or greater than, a radius of the opening 114, so that a complete layer of insoluble material (e.g., acid deprotected resin) is formed at the depth of the target material layer 108.

The thickness of the insoluble material layer formed via acid diffusion into the portion 120 is generally dependent on the acid diffusion length and the thickness of the grafting material 116. In some embodiments, the acid diffusion length and profile may be dependent on the composition of the acid generator included within the grafting material 116, the molecular weight of the generated acid, the composition of the fill material 118, the bake temperature and/or the bake time. In some embodiments, one or more of these properties or parameters may be adjusted or controlled to alter the diffusion length and/or profile of the acid diffusion.

Figure 1E:
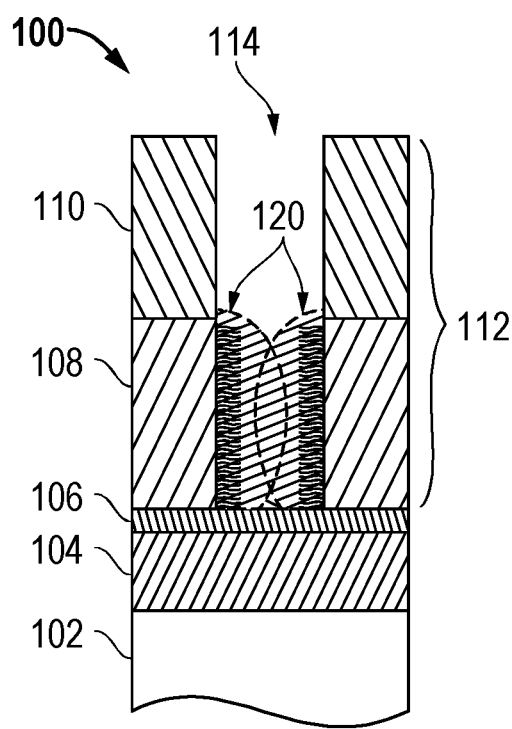

After the solubility-shifting agent is activated to selectively deprotect the portion 120 of the fill material 118 adjacent to and surrounding the grafting material 116, a wet development process is used to recess the fill material 118 within the opening 114. In some embodiments, the wet development process may recess the fill material 118 within the opening 114 by using a first solvent (e.g., an organic solvent) to remove a protected portion 122 of the fill material 118 overlying the deprotected portion 120, as shown in FIG. 1E. In some embodiments, the wet development process may end once the protected portion 122 of the fill material 118 is removed.

In other embodiments, the wet development process may recess the fill material 118 within the opening 114 by alternating between a plurality of solvents to progressively remove the protected and deprotected portions of the fill material 118 from the opening 114. For example, the wet development process may alternate between: (a) using a first solvent to remove the protected portion 122 of the fill material 118 overlying the deprotected portion 120 of the fill material 118 (as shown in FIG. 1E), and (b) subsequently using a second solvent to remove the deprotected portion 120 of the fill material 118 (not shown). In some embodiments, the first solvent may be an organic solvent and the second solvent may be an aqueous solvent. It is recognized, however, that the solvents used to remove the protected and deprotected portions of the fill material 118 are not strictly limited to organic and aqueous solvents. Other solvents may be used to remove the protected/deprotected portions of the fill material, as is known in the art. In some embodiments, the first solvent may be n-butyl acetate or 2-heptanone and the second solvent may be tetra-methyl ammonium hydroxide.

In some embodiments, the fill material 118, the solubility-shifting agent (e.g., acid generator), and/or the solvent(s) may be selected to ensure that the deprotected portion 120 of the fill material 118 has high dissolution contrast in the chosen solvents, compared to the protected portion 122 of the fill material 118. In this manner, each development step may remove one layer of protected or deprotected fill material, depending on the composition of the solvent being used.

In some embodiments, the amount of recess achieved by using the technique shown in FIGS. 1A-1E may be dependent on the composition of the multilayer stack 112 (e.g., the number of isolated target material layer(s) 108 provided within the multilayer stack 112), the thickness of the grafting material 116 selectively deposited onto the sidewall surfaces of the target material layer(s) 108, and the diffusion length of the solubility-shifting agent. After the grafting material 116 is selectively deposited and the fill material 118 is selectively deprotected, as shown in FIGS. 1B-1D and described herein, a wet development process of alternating solvents (e.g., alternating organic and aqueous solvents) may be repeated any number of times needed to achieve a desired recess depth within a particular multilayer stack, provided that isolated target material layer(s) 108 are formed within the stack.

It is recognized that the techniques disclosed herein may be utilized during the processing of a wide range of substrates. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow, for example any of the numerous photolithography steps which may be utilized to form a completed substrate.

It is recognized that the techniques disclosed herein may be utilized during the fabrication of a wide variety of semiconductor structures and/or devices on/within a substrate. For example, FIGS. 2A-2M illustrate an example process flow, which uses the techniques described herein to recess a fill material within openings formed within multilayer stacks used to form Complementary Field Effect Transistors (CFETs). Another example process flow used to form recesses in a Self-Aligned Block (SAB) process is shown in FIGS. 3A-3B. It is recognized that the disclosed techniques are not limited to the example process flows shown and described herein, and may be used when forming other semiconductor structures and/or devices.

FIGS. 2A-2M illustrate an example process flow for selective epitaxial silicon growth in monolithic Complementary FET (CFET) designs. Monolithic CFET design enables the vertical stacking of n-type and p-type transistors. Fabricating vertically stacked complementary transistors requires many processes, which are selective to each transistor type, to be performed without interfering in the fabrication of the other transistor type. One key process is the growth of epitaxial silicon doped for each corresponding transistor type, and the required blocking of the opposing silicon channel during such growth. As shown in FIGS. 2A-2M and described in more detail below, the techniques disclosed herein can be used to provide a self-aligned and scalable process that defines the n/p separation in monolithic CFET designs and enables selective epitaxial silicon growth on each complementary doped channel.

FIGS. 2A-2M illustrate an example process flow, which uses the techniques disclosed herein to recess a fill material within openings formed within multilayer stack 212 provided on one or more underlying layers 202 of a patterned substrate 200. In the embodiment shown in FIGS. 2A-2M, the multilayer stack 212 comprises upper silicon channels 204 and lower silicon channels 206, which are doped to form n-type and p-type channel regions in a monolithic CFET design. In the embodiment shown in FIG. 2A, the silicon channels are separated or isolated with a silicon-germanium (SiGe) layer 208. In some embodiments, a nitride layer 210 may be formed on the uppermost SiGe layer 208.

After inner spacers 207 are formed on each of the SiGe layers 208, a grafting material 216 (such as a self-aligned monolayer, or SAM) is selectively deposited within an opening 214 formed within the multilayer stack 212. More specifically, and as shown in FIG. 2B, grafting material 216 is selectively deposited onto the exposed sidewall surfaces of the upper silicon channels 204 and the lower silicon channels 206. As noted above, the grafting material 216 may contain, or be functionalized with, a solubility-shifting agent (such as an acid generator), which can be activated to change the solubility of a layer adjacent to the grafting material 216.

After the grafting material 216 is selectively deposited, the opening 214 is filled with a deprotectable material 218, as shown in FIG. 2C. In some embodiments, the deprotectable material 218 may be an acid deprotectable resin (or acid protected resin), which can be deprotected with an acid.

After the opening 214 is filled with a deprotectable material 218, the solubility-shifting agent (e.g., an acid-generator) within the grafting material 216 is activated to produce acid localized to the grafting material 216. The patterned substrate 200 is then baked to diffuse the acid outward into the deprotectable material 218, as shown in FIG. 2D. Activation and diffusion of the solubility-shifting agent causes solubility changing reactions to occur within a radial distance from the sidewall surfaces of the upper silicon channels 204 and the lower silicon channels 206, thus forming a complete layer of deprotected material 220 (e.g., a deprotected resin layer) in the vicinity of the upper and lower silicon channels. The thickness of the deprotected resin layer is defined by the thickness of the silicon channel(s) and the acid diffusion length. The separation between the n-type and p-type channels is designed such that a layer of deprotectable material 218 (acid protected resin) remains between the n-type channel region and p-type channel region.

Figure 2E:
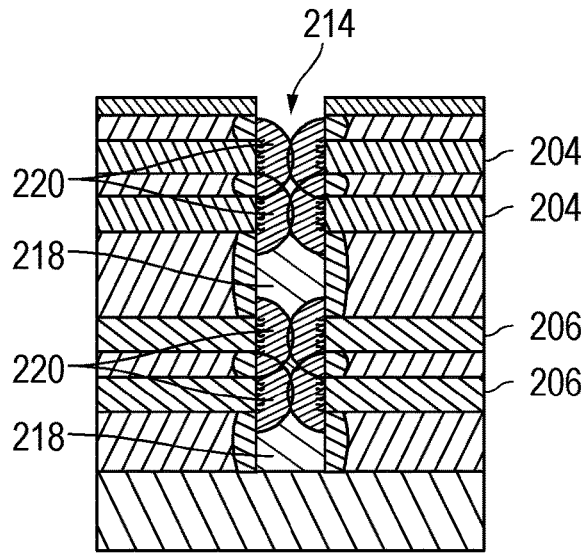
Figure 3A:
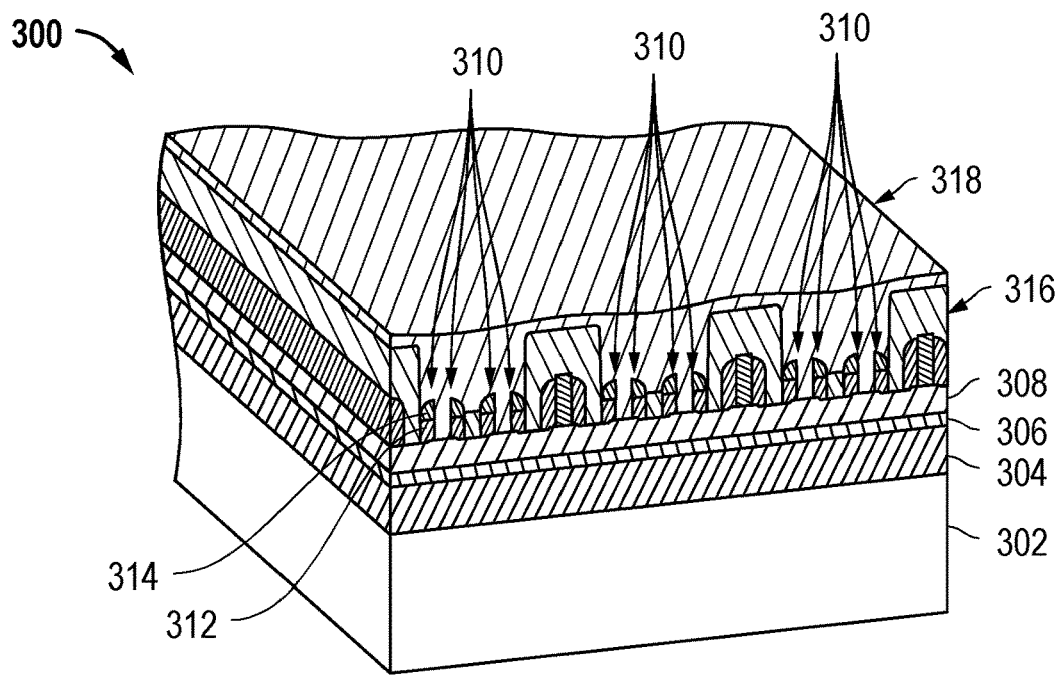
FIG. 3A illustrates one example of a patterned substrate formed in accordance with a Self-Aligned Block (SAB) process after a fill material has been deposited onto the patterned substrate to fill openings formed between a plurality of multilayer spacers provided on the patterned substrate.
Figure 3B:
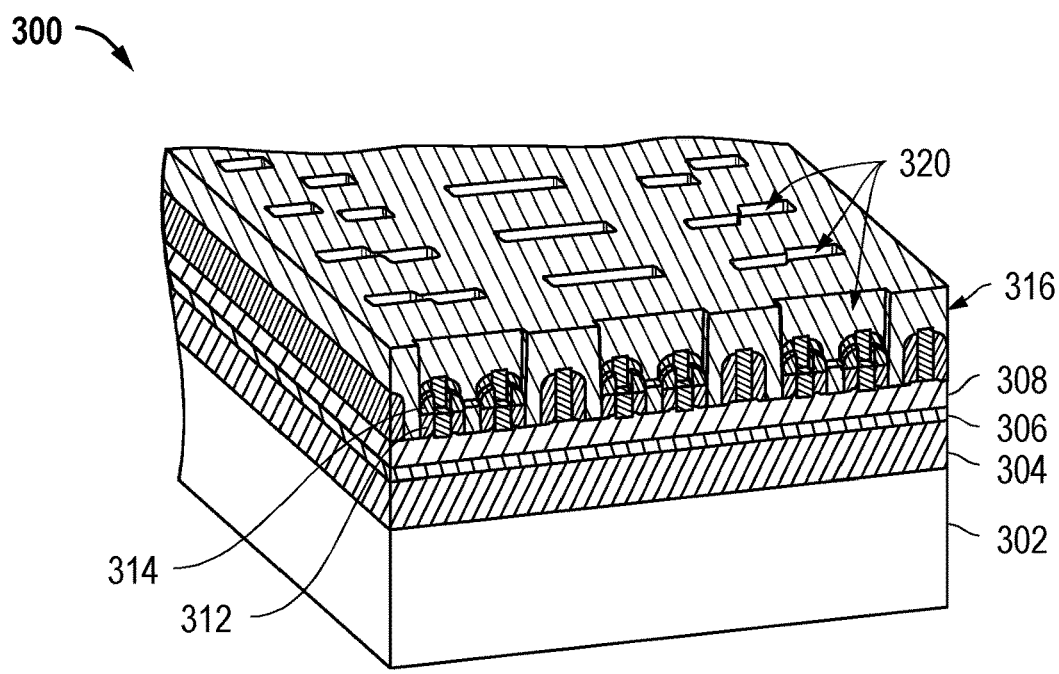
FIG. 3B illustrates the patterned substrate shown in FIG. 3A after the fill material is recessed within the multilayer spacers in accordance with the techniques disclosed herein.

In FIG. 2E, the patterned substrate 200 is developed in an organic solvent to remove the deprotectable material 218 (acid protected resin) from the top of the patterned substrate 200. This development step exposes the uppermost layer of deprotected material 220 formed adjacent to the upper silicon channels 204, and recesses the deprotectable material 218 within the opening 214 to a depth defined by the uppermost layer of deprotected material 220.

Figure 2F:
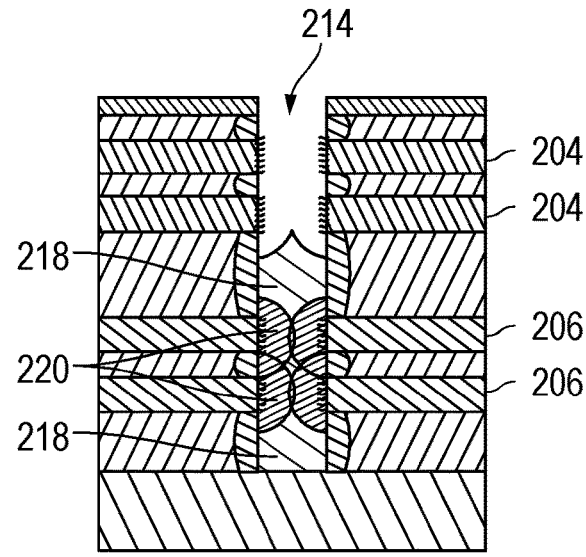

In FIG. 2F, the patterned substrate 200 is developed in an aqueous media to remove the uppermost layer of deprotected material 220 (deprotected resin layer) from the opening 214. This development step exposes the upper silicon channels 204 and the deprotectable material 218 (acid protected resin) arranged between the upper silicon channels 204 and the lower silicon channels 206.

Figure 2G:
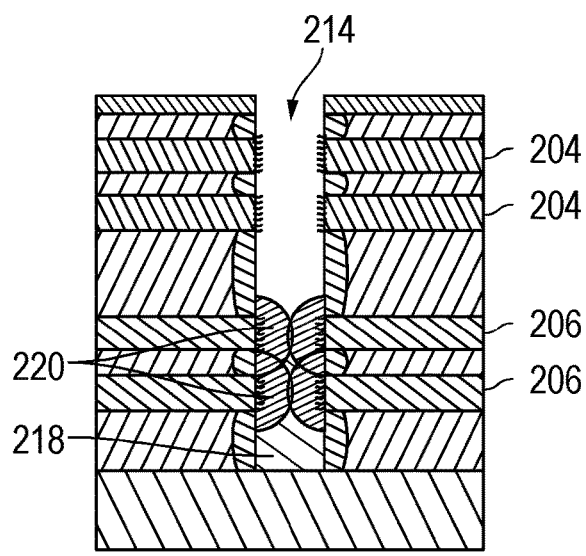

In FIG. 2G, a second organic development is performed to remove the layer of deprotectable material 218 (acid protected resin) arranged between the upper silicon channels 204 and the lower silicon channels 206. This development step exposes the next layer of deprotected material 220 formed adjacent to the lower silicon channels 206, and recesses the deprotectable material 218 within the opening 214 to a desired recess depth defined by the next layer of deprotected material 220. By utilizing the process steps shown in FIGS. 2B-2G, the techniques disclosed herein can be used to recess the deprotectable material 218 within the opening 214 to a desired recess depth, which exposes the upper silicon channels 204, while protecting the lower silicon channels 206 from subsequent processing.

Figure 2H:
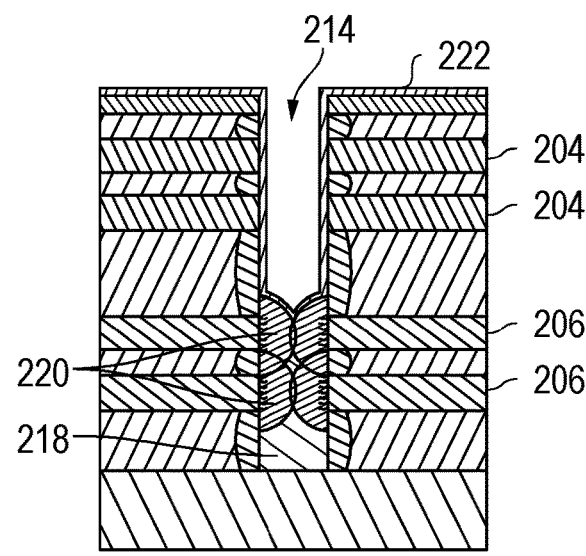
Figure 2I:
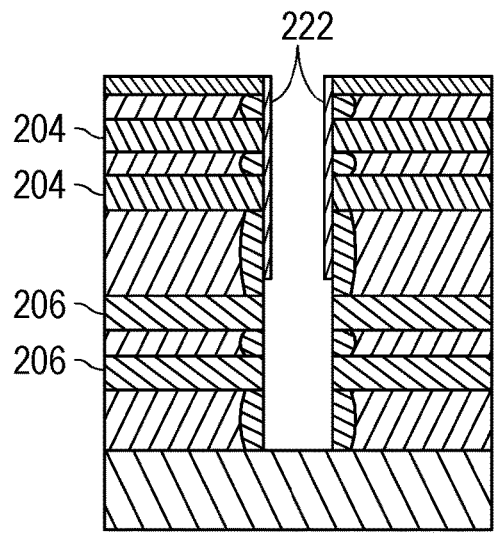
Figure 2J:
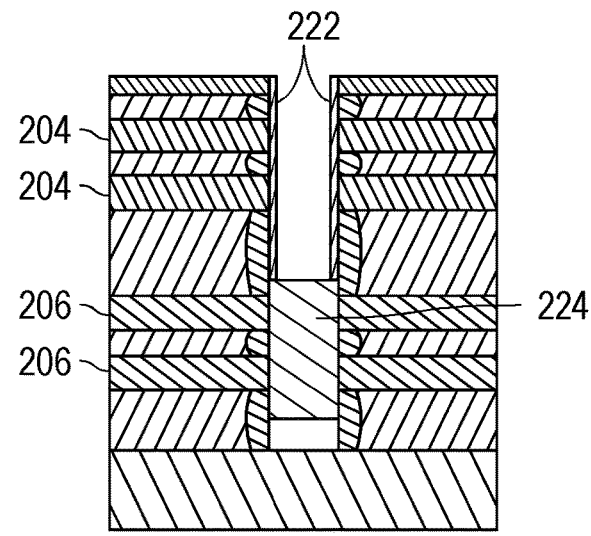
Figure 2K:
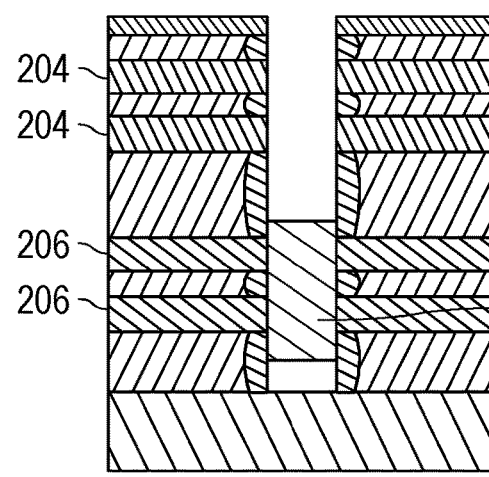
Figure 2L:
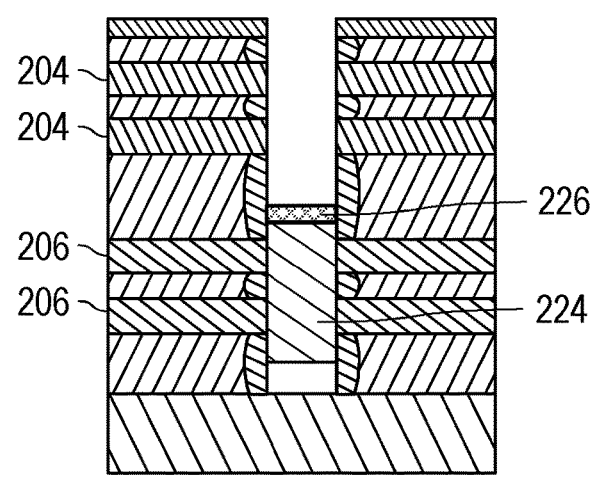
Figure 2M:
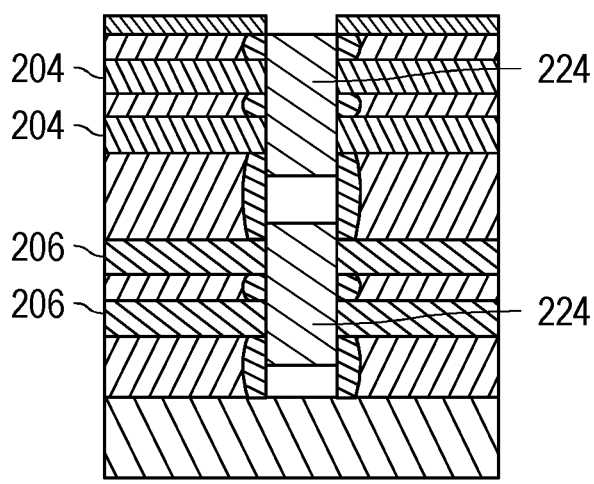

In FIG. 2H, a liner 222 is deposited conformally over the top of the patterned substrate 200, the sidewalls of the opening 214 and the top of the remaining deprotected material 220. In FIG. 2I, an anisotropic etch is performed to remove the liner 222 from the top of the patterned substrate 200 and to remove the remaining deprotected material 220, leaving the sidewall surfaces of the opening 214 covered by the liner 222 to the desired recess depth. After the patterned substrate 200 undergoes a silicon clean step, epitaxial features 224 are selectively formed on the lower silicon channels 206, as shown in FIG. 2J. After the epitaxial features are formed on the lower silicon channels 206, the liner 222 is removed in FIG. 2K and an encapsulation layer 226 is selectively grown on the epitaxial features 224 formed on the lower silicon channels in FIG. 2L. After the encapsulation layer 226 is grown, an additional epitaxial process is performed to enable selective growth of epitaxial features 224 on the upper silicon channels 204 (as shown in FIG. 2M) without interference from, or contamination of, the underlying layer.

Self-Aligned Block (SAB) is an advanced multicolor process flow designed to pattern sub-resolution cuts into high resolution features for state-of-the-art integrated circuits. A key step in this process flow often requires the partial recess of a fill material (such as, e.g., spin-on glass) within openings formed between spacers provided on a patterned substrate. The recess step typically requires nanometer-level precision. If the recess formed between the spacers is too shallow or too deep, the entire process may fail. To avoid this problem, the techniques disclosed herein can be implemented by transforming the spacer pattern into a multilayer stack having a target material layer and at least one additional layer overlying the target material layer, wherein the thickness of the target material layer is tuned to the desired recess depth.

FIGS. 3A-3B illustrate an example process flow that may be used to form recesses in a Self-Aligned Block (SAB) process. More specifically, FIG. 3A illustrates one example of a patterned substrate 300 formed in accordance with a SAB process after a fill material 318 has been deposited onto the patterned substrate 300 to fill openings formed between a plurality of multilayer spacers 310 provided on the patterned substrate 300. FIG. 3B illustrates the patterned substrate 300 shown in FIG. 3A after the fill material 318 is recessed within the multilayer spacers 310 in accordance with the techniques described herein.

The multilayer spacers 310 shown in FIG. 3A may generally be formed on one or more underlying layers. In some embodiments, for example, the multilayer spacers 310 may generally be formed over one or more underlying layers, such as but not limited to, a hard mask layer 308, an interlevel dielectric layer 306, a low-k dielectric layer 304 and a base substrate layer 302. Base substrate layer 302 may be any substrate for which the use of patterned features is desirable. The hard mask layer 308, an interlevel dielectric layer 306, a low-k dielectric layer 304 shown in FIG. 3A may be formed from any of a wide variety of materials, as is known in the art. Although exemplary underlying layers are described and shown in the figures, the techniques described herein are not limited to any particular type or number of layers underlying the multilayer spacers 310. As such, more, less or other underlying layers may be utilized.

In order to utilize the techniques disclosed herein, the multilayer spacers 310 shown in FIGS. 3A-3B may be formed, so as to include at least two different material layers, including at least one target material layer 312 and one or more additional material layers 314 overlying the target material layer. In some embodiments, the multilayer spacers 310 may be formed using a self-aligned multiple patterning (SAMP) process such as, for example, a self-aligned double patterning (SADP) process, a self-aligned quadruple patterning (SAQP) process, a self-aligned octuple patterning (SAOP) process, etc. SAMP processes are well known in the art.

In one example SAMP process, the multilayer spacers 310 may be formed on the patterned substrate 300 by: forming a target material layer 312 onto the hard mask layer 308, forming a plurality of mandrels (not shown) on the target material layer 312, and forming one or more additional material layers 314 over the mandrels and exposed surfaces of the target material layer 312. Once the additional material layer(s) 314 are formed, an etch process may be used to remove portions of the additional material layer(s) 314 from the upper surfaces of the mandrels and the exposed surfaces of the target material layer 312, leaving additional material layer spacers on the sidewalls of the mandrels. After a mandrel pull step is performed to remove the mandrels from the patterned substrate 300, another etch process may be used to etch the target material layer 312, thus forming the multilayer spacers 310 shown in FIGS. 3A-3B.

After the multilayer spacers 310 are formed, a spin-on carbon (SOC) layer 316 may be formed on the patterned substrate 300, as shown in FIG. 3B. Next, a fill material 318 may be deposited (or otherwise formed) on top of the patterned substrate 300 and within the openings 320 formed within the SOC layer 316. In one example embodiment, the fill material 318 may be a spin-on glass (SOG).

After the openings 320 are filled with the fill material 318, the techniques shown in FIGS. 1B-1E and described above may be used to recess the fill material 318 within the multilayer spacers 310. By utilizing the techniques disclosed herein, the fill material 318 can be recessed within the multilayer spacers 310 with high precision to a desired recess depth, which is defined by the target material layer 312 included within the multilayer spacers 310 (as shown in FIG. 3B).

Figure 4:
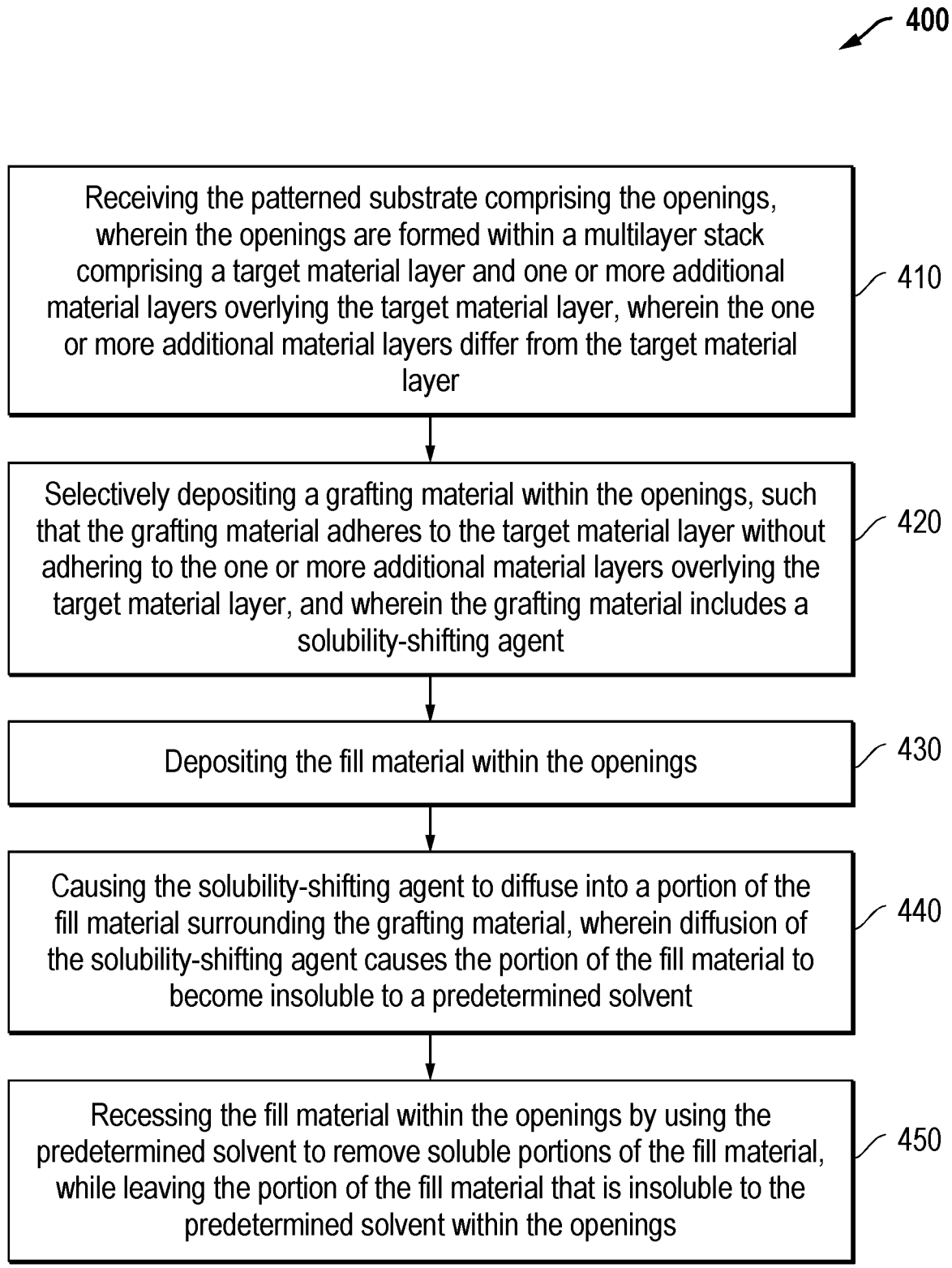
FIG. 4 is a flowchart diagram illustrating one embodiment of a method utilizing the techniques described herein.
Figure 5:
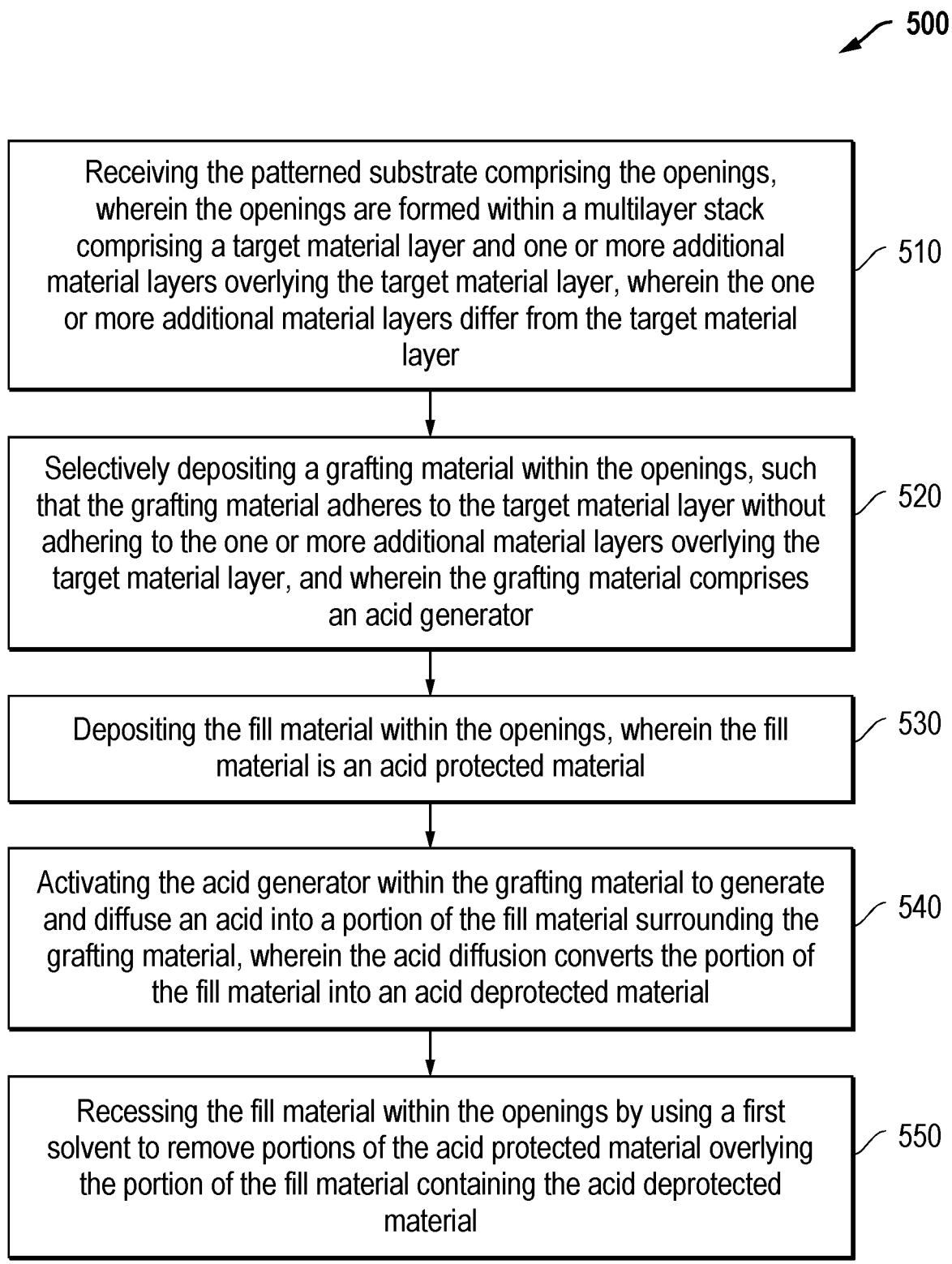
FIG. 5 is a flowchart diagram illustrating another embodiment of a method utilizing the techniques described herein.

FIGS. 4-5 illustrate exemplary methods that utilize the techniques described herein. It will be recognized that the embodiments shown in FIGS. 4-5 are merely exemplary and additional methods may utilize the techniques described herein. Further, additional processing steps may be added to the methods shown in the FIGS. 4-5 as the steps described are not intended to be exclusive. Moreover, the order of the steps is not limited to the order shown in the figures as different orders may occur and/or various steps may be performed in combination or at the same time.

FIG. 4 illustrates one embodiment of a method 400 for recessing a fill material within a plurality of openings formed within a patterned substrate. The method 400 shown in FIG. 4 may generally begin by receiving a patterned substrate comprising the openings (in step 410). In method 400, the openings formed within the patterned substrate are formed within a multilayer stack comprising a target material layer and one or more additional material layers overlying the target material layer, wherein the additional material layer(s) differ from the target material layer. FIGS. 1-3 provide examples of various openings that may be formed within a multilayer stack. It will be recognized, however, the method 400 shown in FIG. 4 is not strictly limited to only the examples shown and described herein.

In step 420, the method 400 selectively deposits a grafting material within the openings, such that the grafting material adheres to the target material layer without adhering to the one or more additional material layers overlying the target material layer. In the embodiment shown in FIG. 4, the grafting material includes a solubility shifting agent.

After selectively depositing the grafting material (in step 420), the method 400 deposits a fill material within the openings (in step 430) before causing the solubility-shifting agent to diffuse into a portion of the fill material surrounding the grafting material (in step 440). In the embodiment shown in FIG. 4, the diffusion of the solubility-shifting agent causes the portion of the fill material to become insoluble to a predetermined solvent. In step 450, the method 400 recesses the fill material within the openings by using the predetermined solvent to remove soluble portions of the fill material, while leaving the portion of the fill material that is insoluble to the predetermined solvent within the openings.

FIG. 5 illustrates another embodiment of a method 500 for recessing a fill material within a plurality of openings formed within a patterned substrate. Like the method 400 shown in FIG. 4, the method 500 shown in FIG. 5 may generally begin by receiving a patterned substrate comprising the openings (in step 510). As noted above, the openings may be formed within a multilayer stack comprising a target material layer and one or more additional material layers overlying the target material layer, wherein the additional material layer(s) differ from the target material layer.

In step 520, the method 500 selectively deposits a grafting material within the openings, such that the grafting material adheres to the target material layer without adhering to the one or more additional material layers overlying the target material layer. In the embodiment shown in FIG. 5, the grafting material includes an acid generator.

After selectively depositing the grafting material (in step 520), the method 500 deposits a fill material within the openings (in step 530), the fill material being an acid protected material. In step 540, the method 500 activates the acid generator within the grafting material to generate and diffuse an acid into a portion of the fill material surrounding the grafting material. The acid diffusion converts the portion of the fill material into an acid deprotected material. In step 550, the method 500 recesses the fill material within the openings by using a first solvent to remove portions of the acid protected material overlying the portion of the fill material containing the acid deprotected material.

It is noted that various deposition processes can be used to form one or more of the material layers shown and described herein. For example, one or more depositions can be implemented using chemical vapor deposition (CVD), plasma enhanced CVD (PECVD), physical vapor deposition (PVD), atomic layer deposition (ALD), and/or other deposition processes. It is further noted that various etch processes can be used to etch one or more of the material layers shown and described herein. For example, one or more etch processes can be implemented using plasma etch processes, discharge etch processes, and/or other desired etch processes.

Various operational parameters can also be adjusted to control the various deposition and/or etch processes described herein. Examples of operational parameters may include, but are not limited to, the chamber temperature, chamber pressure, power (such as source/bias power), flow-rates of gases, types of gases or gas chemistries, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for recessing a fill material within openings formed within a patterned substrate, the method comprising:
   receiving the patterned substrate comprising the openings, wherein the openings are formed within a multilayer stack comprising a target material layer and one or more additional material layers overlying the target material layer, wherein the one or more additional material layers differ from the target material layer;
   selectively depositing a grafting material within the openings, such that the grafting material adheres to the target material layer without adhering to the one or more additional material layers overlying the target material layer, and wherein the grafting material includes a solubility-shifting agent;
   depositing the fill material within the openings;
   causing the solubility-shifting agent to diffuse into a portion of the fill material surrounding the grafting material, wherein diffusion of the solubility-shifting agent causes the portion of the fill material to become insoluble to a predetermined solvent; and
   recessing the fill material within the openings by using the predetermined solvent to remove soluble portions of the fill material, while leaving the portion of the fill material that is insoluble to the predetermined solvent within the openings.

2. The method of claim 1, wherein the predetermined solvent removes the soluble portions of the fill material to a depth within the openings defined by the solubility-shifting agent and physical characteristics of the target material layer.

3. The method of claim 1, wherein the grafting material is selectively deposited onto opposing sidewalls of the openings at a depth defined by the target material layer, and wherein the solubility-shifting agent causes solubility changing reactions to occur within a region, which extends radially from the grafting material deposited onto the opposing sidewalls into the portion of the fill material to form a complete layer of insoluble material at the depth of the target material layer.

4. The method of claim 1, wherein the grafting material is selectively deposited within the openings by forming self-assembled monolayers (SAMs) on opposing sidewall surfaces of the target material layer, and wherein the fill material is an acid protected resin.

5. The method of claim 4, wherein the SAMs are functionalized with a photo-acid generator (PAG) or a thermal-acid generator (TAG).

6. The method of claim 4, wherein the SAMs are functionalized with a photo-acid generator (PAG), and wherein said causing the solubility-shifting agent to diffuse into the portion of the fill material surrounding the grafting material comprises:
  irradiating the PAG to generate an acid; and
  performing a bake process to diffuse the acid into the portion of the fill material,
  wherein diffusing the acid converts the acid protected resin within the portion of the fill material into an acid deprotected resin.

7. The method of claim 4, wherein the SAMs are functionalized with a thermal-acid generator (TAG), and wherein said causing the solubility-shifting agent to diffuse into the portion of the fill material surrounding the grafting material comprises:
  performing a bake process to generate an acid and diffuse the acid into the portion of the fill material; and
  wherein diffusing the acid converts the acid protected resin within the portion of the fill material into an acid deprotected resin.

8. The method of claim 1, wherein the predetermined solvent is an organic solvent.

9. The method of claim 1, wherein after using the predetermined solvent to remove soluble portions of the fill material, said recessing the fill material further comprises:
  using an aqueous solvent to remove the portion of the fill material that is insoluble to the predetermined solvent from the openings.

10. A method for recessing a fill material within openings formed within a patterned substrate, the method comprising:
  receiving the patterned substrate comprising the openings, wherein the openings are formed within a multilayer stack comprising a target material layer and one or more additional material layers overlying the target material layer, wherein the one or more additional material layers differ from the target material layer;
  selectively depositing a grafting material within the openings, such that the grafting material adheres to the target material layer without adhering to the one or more additional material layers overlying the target material layer, and wherein the grafting material comprises an acid generator;
  depositing the fill material within the openings, wherein the fill material is an acid protected material;
  activating the acid generator within the grafting material to generate and diffuse an acid into a portion of the fill material surrounding the grafting material, wherein diffusing the acid converts the portion of the fill material into an acid deprotected material; and
  recessing the fill material within the openings by using a first solvent to remove portions of the acid protected material overlying the portion of the fill material containing the acid deprotected material.

11. The method of claim 10, wherein the grafting material is selectively deposited onto opposing sidewalls of the openings at a depth defined by the target material layer, and wherein the acid diffuses radially from the grafting material deposited onto the opposing sidewalls into the portion of the fill material to form a complete layer of acid deprotected material at the depth of the target material layer.

12. The method of claim 10, wherein the grafting material is selectively deposited within the openings by forming self-assembled monolayers (SAMs) on opposing sidewall surfaces of the target material layer.

13. The method of claim 12, wherein a head group of the SAMs comprise a thiol, a carboxylic acid, a phosphinic acid or a silane.

14. The method of claim 10, wherein the acid generator is a photo-acid generator (PAG), and wherein said activating the acid generator comprises:
  irradiating the PAG to generate the acid; and
  performing a bake process to diffuse the acid into the portion of the fill material.

15. The method of claim 10, wherein the acid generator is a thermal-acid generator (TAG), and wherein said activating the acid generator comprises performing a bake process to generate the acid and diffuse the acid into the portion of the fill material.

16. The method of claim 10, wherein diffusing the acid is localized to a region encompassing the grafting material.

17. The method of claim 10, wherein said activating the acid generator comprises a bake process, and wherein a diffusion length and profile of diffusing the acid is dependent on a composition of the acid generator, a composition of the fill material, a bake temperature, a bake time and/or a molecular weight of the acid.

18. The method of claim 10, wherein the first solvent is an organic solvent.

19. The method of claim 10, wherein after using the first solvent to remove portions of the acid protected material overlying the portion of the fill material containing the acid deprotected material, said recessing the fill material further comprises using a second solvent to remove the portion of the fill material containing the acid deprotected material.

20. The method of claim 19, wherein the second solvent is an aqueous solvent.

* * * * *